(12) United States Patent
Poeppel et al.

(10) Patent No.: US 8,035,224 B2
(45) Date of Patent: Oct. 11, 2011

(54) SEMICONDUCTOR DEVICE

(75) Inventors: Gerhard Josef Poeppel, Regensburg (DE); Irmgard Escher-Poeppel, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 191 days.

(21) Appl. No.: 12/271,662

(22) Filed: Nov. 14, 2008

(65) Prior Publication Data

US 2010/0123217 A1 May 20, 2010

(51) Int. Cl.
 *H01L 23/34* (2006.01)
(52) U.S. Cl. ............... 257/724; 257/E23.141; 257/738; 257/777; 438/107
(58) Field of Classification Search ........... 257/E23.141, 257/E21.499, 536, 724, 737, 738, 777, 686, 257/698; 438/110; 361/141, 146
See application file for complete search history.

(56) References Cited

U.S. PATENT DOCUMENTS

| | | | | |
|---|---|---|---|---|
| 4,430,255 A * | 2/1984 | Yan | ................................ | 252/512 |
| 6,356,453 B1 * | 3/2002 | Juskey et al. | .................. | 361/760 |
| 6,362,525 B1 * | 3/2002 | Rahim | ........................... | 257/738 |
| 6,545,364 B2 * | 4/2003 | Sakamoto et al. | ............. | 257/773 |
| 6,856,007 B2 * | 2/2005 | Warner | ........................... | 257/678 |
| 6,864,121 B2 * | 3/2005 | Sakamoto et al. | ............. | 438/110 |
| 6,961,245 B2 * | 11/2005 | Ikuta et al. | ..................... | 361/719 |
| 7,042,087 B2 * | 5/2006 | Sakamoto et al. | ............. | 257/734 |
| 7,095,112 B2 * | 8/2006 | Endo et al. | ..................... | 257/724 |
| 7,274,100 B2 * | 9/2007 | Pavier et al. | ..................... | 257/724 |
| 2002/0017730 A1 * | 2/2002 | Tahara et al. | .................. | 257/786 |
| 2004/0238934 A1 * | 12/2004 | Warner et al. | .................. | 257/686 |
| 2008/0079461 A1 | 4/2008 | Lin et al. | | |

OTHER PUBLICATIONS

Brunnbauer et al., "Embedded Wafer Level Ball Grid Array (eWLB)," 2006 Electronics Packaging Technology Conference, Copyright 2006, 5 pages.
"Sanmina-Sci Manufacturers World's First Prototype Printed Circuit Board with 100 Percent Embedded ESD Protection," Sanmina-Sci Press Release, San Jose, CA., Aug. 8, 2007, 3 pages.

* cited by examiner

*Primary Examiner* — Chris Chu
(74) *Attorney, Agent, or Firm* — Dicke, Billig & Czaja, PLLC

(57) ABSTRACT

A semiconductor package includes a semiconductor chip having an integrated circuit, a functional element electrically coupled with the integrated circuit, and an array of contact elements connected with the integrated circuit and the functional element. The functional element is configured to protect the integrated circuit from transient voltage.

9 Claims, 10 Drawing Sheets

SEMICONDUCTOR DEVICE

BACKGROUND

Semiconductor chips are generally fabricated on a silicon wafer. Recent developments include adding components to increase functionality of the semiconductor chips, and the components tend to occupy some amount of "real estate" on the chip. In addition, electronic devices are becoming smaller, and consumers and manufacturers have a desire to thus make the semiconductor chips smaller. The increase in functionality and miniaturization of semiconductor chips presents challenges to semiconductor chip, device, and package manufacturers.

For these and other reasons there is a need for the present invention.

SUMMARY

One embodiment provides a semiconductor package including a semiconductor chip having an integrated circuit, a functional element electrically coupled with the integrated circuit, and an array of contact elements connected with the integrated circuit and the functional element. The functional element is configured to protect the integrated circuit from transient voltage.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

Figure 1:
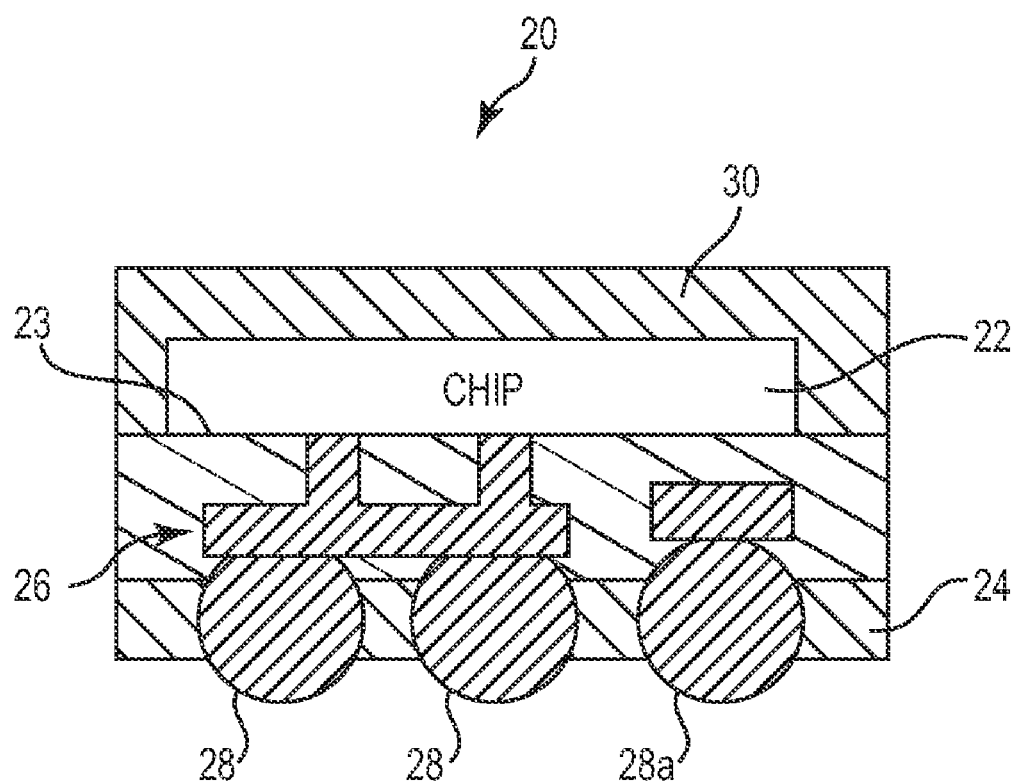
FIG. 1 is a schematic cross-sectional view of a semiconductor device according to one embodiment.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

In this specification, "varistor" means an electronic component having a significant non-ohmic current-voltage characteristic. A varistor as provided herein is configured to protect an integrated circuit against transient voltage, such that when the varistor is triggered, it will shunt current created by the transient voltage away from the integrated circuit and/or other sensitive components.

In this specification, "transient voltage" means an excessive voltage that gives rise to a current that has the potential to harm an integrated circuit.

Embodiments provide semiconductor devices including electrostatic discharge (ESD) protection incorporated into encapsulation areas of the package, which provides an easily manufactured and inexpensive solution.

Embodiments provide one or more functional elements integrated into a semiconductor package, where each functional element is configured to provide ESD protection for components in the package. The functional elements are incorporated into the package and electrically coupled with one or more semiconductor chips without occupying silicon real estate (the available area) of the chip. In one embodiment, the functional element is provided as a layer that is electrically connected to the chip. In one embodiment, the functional element is provided as a separate component that is electrically connected to the chip.

In one embodiment, the functional element is a varistor, or a variable resistor, having a significant non-ohmic current-voltage characteristic. In one embodiment, the current-voltage characteristic is configured to be highly non-linear such that the varistor has a high resistance at low voltages and a low resistance at high voltages. In one embodiment, the functional element is a filter, such as a low pass filter or a high pass filter.

Embodiments provide semiconductor devices including an embedded wafer level package including a functional element embedded within the package and configured to provide ESD protection for integrated circuits on semiconductor chips.

Embodiments provide a ball grid array semiconductor device including a functional element connected to the ball grid array and configured to provide ESD protection for integrated circuits in the semiconductor device.

FIG. 1 is a schematic cross-sectional view of a semiconductor device 20 according to one embodiment. Semiconductor device 20 includes a semiconductor chip 22 providing an integrated circuit 23, a functional element 24 electrically coupled with integrated circuit 23, and contact elements 28 connected with integrated circuit 23 and functional element 24.

In one embodiment, semiconductor device 20 includes encapsulation material 30 (material 30) encapsulated over semiconductor chip 22 to provide a semiconductor package.

In one embodiment, functional element 24 is provided as a functional layer 24 or a shunting layer or a varistor layer that is deposited between contact elements 28. For example, in one embodiment a shunting layer is provided between opposed contact elements, at least one of which is connected to chip 22. In one embodiment, functional element 24 or functional layer 24 is electrically coupled with integrated circuit 23 by a redistribution layer 26 (or a metallic trace 26)

In one embodiment, functional layer 24 is formed of a metal oxide material as described below that is configured to shunt current from a high voltage source away from integrated circuit 23. In one embodiment, functional layer 24 is provided as a high pass/low pass filter as described below that is configured to attenuate signals of a desired frequency relative to chip 22. In one embodiment, redistribution layer 26 is structured into a dielectric or other layer to provide metallic interconnection between chip 22 and functional layer 24. In one embodiment, contact 28a is provided as a ground ball and functional layer 24 is provided as a varistor layer configured to shunt transient voltage away from integrated circuit 23.

Figure 2:
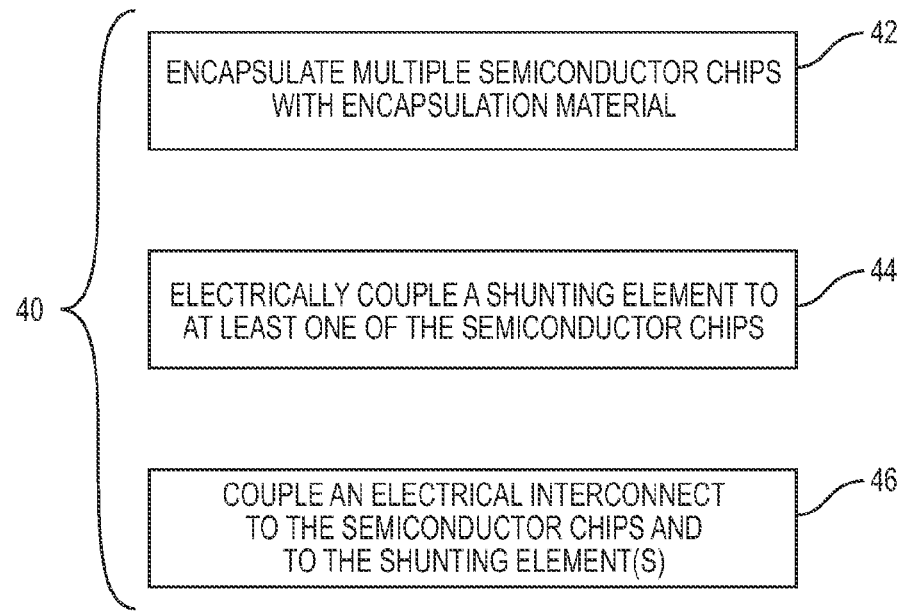
FIG. 2 is a block diagram of a process for fabricating a semiconductor device according to one embodiment.

FIG. 2 is a block diagram of a process 40 for fabricating a semiconductor device, including device 20, according to one embodiment. At 42, multiple semiconductor chips 22 are encapsulated with encapsulation material 30. At 44, a shunting element such as functional layer 24 is electrically coupled to at least one of the semiconductor chips 22. At 46, electrical interconnects, such as provided by redistribution layer 26 and contacts 28, are connected to semiconductor chips 22 and shunting element(s) 24.

Figure 3:
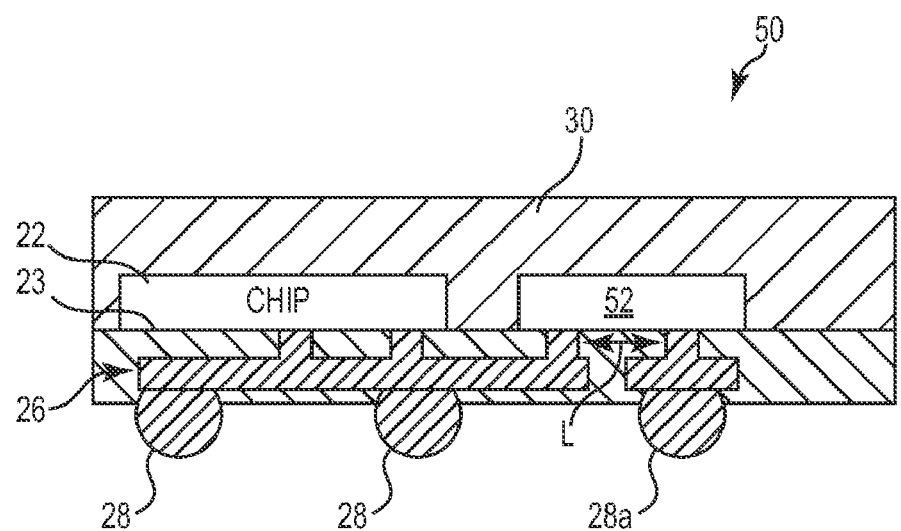
FIG. 3 is a schematic cross-sectional view of a semiconductor package according to one embodiment.

FIG. 3 is a schematic cross-sectional view of a semiconductor package 50 according to one embodiment. Semiconductor package 50 includes semiconductor chip 22 and integrated circuit 23, a functional element 52 electrically coupled with integrated circuit 23 through redistribution layer 26, and contact elements 28 connected with integrated circuit 23 and functional element 52. In one embodiment, chip 22 and functional element 52 are encapsulated by encapsulation material 30 to provide semiconductor package 50. It is to be understood that multiple semiconductor packages 50 are processed together and singulated to provide a single semiconductor package 50 as illustrated.

In one embodiment, functional element 52 is provided as a varistor that electrically connects with ground ball 28a and is electrically connected with chip 22 through redistribution layer 26.

A varistor length L is defined as path length between the ground connect formed with ground ball 28a and the contact formed with redistribution layer 26. The varistor length L is the shortest path through the varistor and relates to the electric strength of the ESD circuit. For example, in the case of a varistor layer deposited between two contact plates, the shortest path through the varistor is equal to the space between the contact plates. In the embodiment of FIG. 3, the varistor length L includes the lateral portion shown and a portion of the path that meanders in the depth dimension (i.e., into the paper). Thus, relative to FIG. 3, the shortest path through the varistor is a meandering path. In all cases for the varistor length L, the shortest distance between the contacts defines the breakthrough voltage for the varistor.

Figure 4:
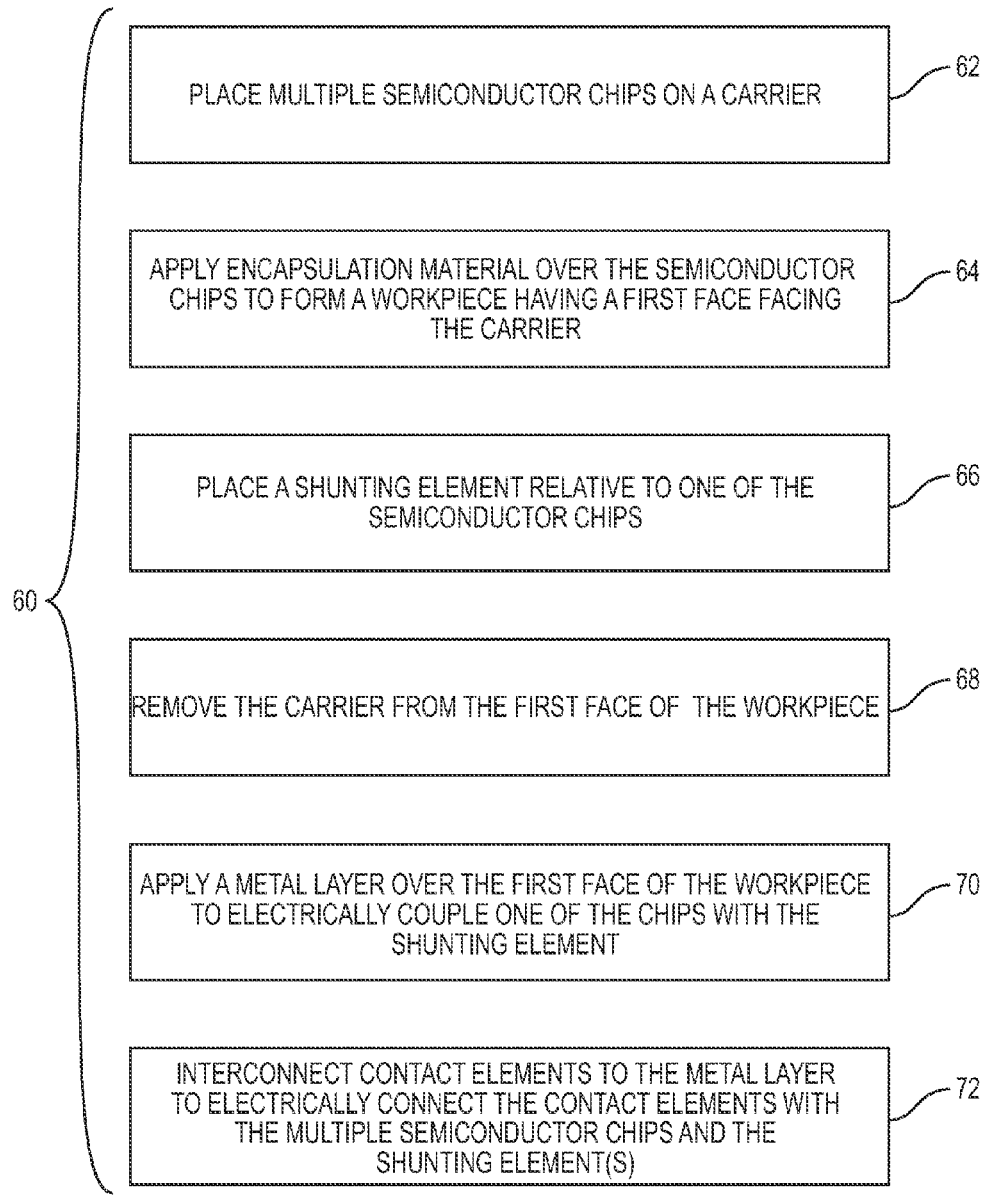
FIG. 4 is a block diagram of a process for fabricating semiconductor packages according to one embodiment.

FIG. 4 is a block diagram of a process 60 for manufacturing semiconductor packages, such as package 50, according to one embodiment. At 62, multiple semiconductor chips 22 are placed on a carrier. At 64, encapsulation material 30 is applied over the semiconductor chips 22 to form a workpiece having a first face facing the carrier. At 66, a shunting element, such as varistor 52, is placed relative to one of semiconductor chips 22. At 68, the carrier is removed from the first face of the workpiece. At 70, a metal layer is applied over the first face of the workpiece to electrically couple one of the chips 22 with the shunting element(s) 52. In one embodiment, the metal layer is redistribution layer 26. At 72, contact elements 28 are interconnected to the metal layer (or redistribution layer 26) to electrically connect the contact elements 28 with the chips 22 and the shunting element(s) 52.

Semiconductor chips 22 include integrated circuits suitably configured as logic circuits, control circuits, microprocessors, or microelectrical-mechanical components. In one embodiment, chips 22 include power semiconductor chips such as power transistors, power diodes, insulated gate bipolar transistors (IGBT), or other suitable chips. In one embodiment, chips 22 include a vertical structure (a Z-directional structure) configured such that electric current flows in the Z-direction perpendicular to the main surfaces of semiconductor device 20.

Encapsulation material 30 is configured to protect portions of the semiconductor package 50 and includes plastics or epoxies or other suitable electrically insulating materials.

Functional elements as described herein are provided either as a functional layer 24 or a discrete element such as varistor 52. In one embodiment, functional element (layer 24 or varistor 52) includes a significant non-ohmic current-voltage characteristic. These functional elements are configured to protect integrated circuits against transient voltages, such that when triggered, they shunt the current created by the high voltage away from the sensitive components of device 20 or package 50.

In one embodiment, the functional elements (layer 24 or element 52) is provided as a metal oxide varistor including a ceramic mass of zinc oxide grains in a matrix of other metal oxides such as bismuth, cobalt, or manganese, sandwiched between two metal plates or electrodes. In one embodiment, the mass of these randomly oriented grains is electrically equivalent to a network of back-to-back diode pairs. When small voltages are applied across the electrodes, only a small current flows, which is caused by reverse leakage through the diode junctions. When large voltages are applied, the diode junctions break down and a large current flows. The resulting behavior provides a highly non-linear current-voltage characteristic. Varistors of these types remain non-conductive and provide a shunt mode device during normal operation when voltages remain below a predetermined "clamping voltage."

In one embodiment, each grain in the matrix is itself a double diode junction such that each grain behaves as a micro-varistor. The pathway from grain-to-grain forms a meandering path that is the varistor length L, as discussed above.

Suitable such functional element shunting devices have a range of sizes between, for example, 0.1-20 mm with clamping voltages between about 6-1000 Volts.

Semiconductor devices and packages as provided herein may be fabricated in a variety of forms.

Figure 5A:
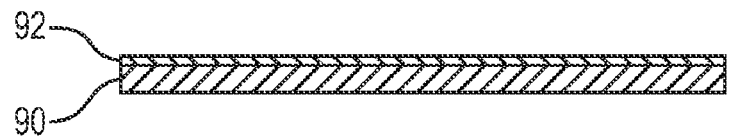
FIGS. 5A-5E illustrate a process for fabricating a semiconductor package as illustrated in FIG. 5F, the semiconductor package including a chip and a functional element encapsulated in encapsulation material according to one embodiment.
Figure 5B:
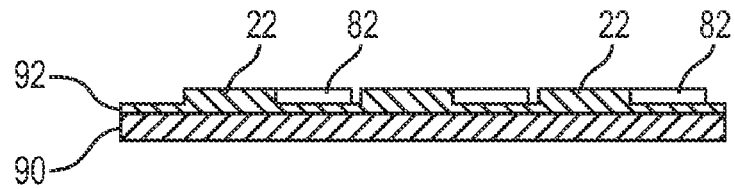
Figure 5C:
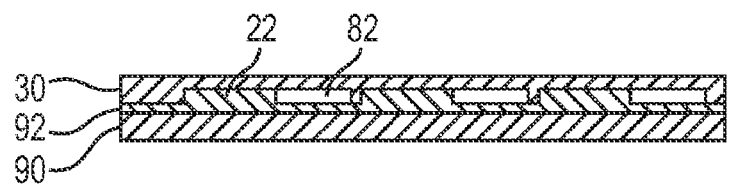
Figure 5D:
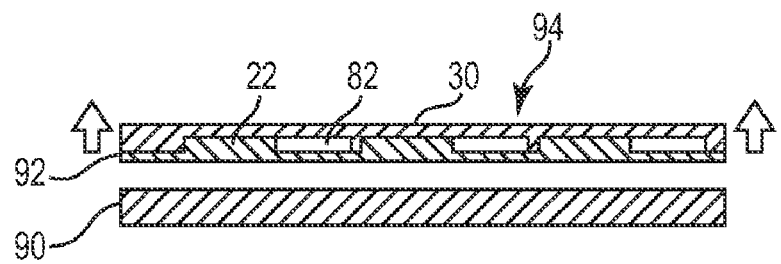
Figure 5E:
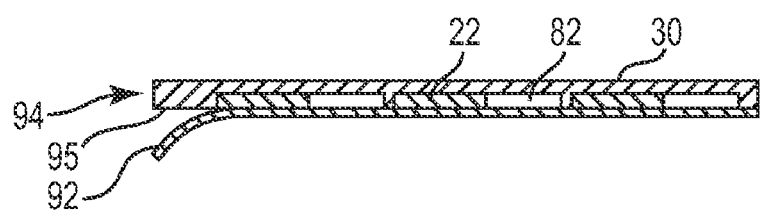
Figure 5F:
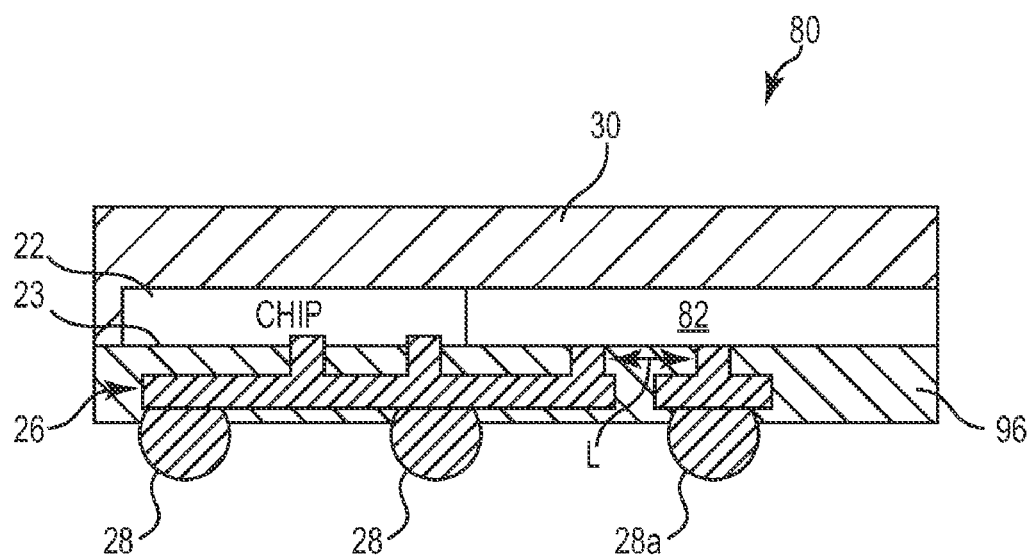

FIGS. 5A-5E illustrate a process for fabricating semiconductor package 80 as illustrated in the schematic cross-sectional view of FIG. 5F. The fabricated semiconductor package 80 of FIG. 5F includes chip 22 and functional element 82 encapsulated by encapsulation material 30, where functional element 82 is electrically connected with chip 22 by redistribution layer 26 and interconnected with contacts 28. In one embodiment, functional element 82 is disposed adjacent to chip 22, and both chip 22 and functional element 82 are encapsulated by material 30.

FIGS. 5A-5E illustrate one suitable process for fabricating semiconductor package 80.

FIG. 5A is a cross-sectional view of a carrier 90 including an adhesive layer 92.

FIG. 5B is a cross-sectional view of chips 22 and functional elements 82 attached to carrier 90 by adhesive layer 92.

FIG. 5C is a cross-sectional view of chips 22 and functional elements 82 encapsulated by encapsulation material 30.

FIG. 5D is a cross-sectional view of a workpiece 94 removed from carrier 90. In one embodiment, workpiece 94 includes chips 22 and functional elements 82 encapsulated in encapsulation material 30.

FIG. 5E is a cross-sectional view of adhesive layer 92 removed from a first face 95 of workpiece 94. Workpiece 94 is suited for subsequent processing after separation from carrier 90.

FIG. 5F is a schematic cross-sectional view of semiconductor package 80 after subsequent processing to include the interconnected redistribution layer 26 and contacts 28. In one embodiment, workpiece 94 (FIG. 5E) is subsequently processed in a suitable embedded wafer-level package manner to include a dielectric layer 96 that is structured with interconnecting metal traces 26 and contacts 28. For example, in one embodiment metal traces 26 are photolithographically patterned in dielectric layer 96 to provide redistribution layer 26 connecting chip 22 with functional element 82. Contacts 28 (for example solder balls) are deposited on pads and electrically connected with redistribution layer 26. Other suitable processes for electrically connecting chip 22 with functional element 82 are also acceptable.

FIGS. 6-9 provide multiple embodiments of semiconductor devices including at least one functional element that is electrically coupled to an integrated circuit of at least one semiconductor chip. In one embodiment, the functional element is provided as a layer where the varistor may be selectively varied to effectively scale the desired size of ESD/voltage protection to nearly any level. In one embodiment, the functional element is provided as a discrete varistor element, where the varistor dimension defines the electric strength of the ESD circuit.

Figure 6:
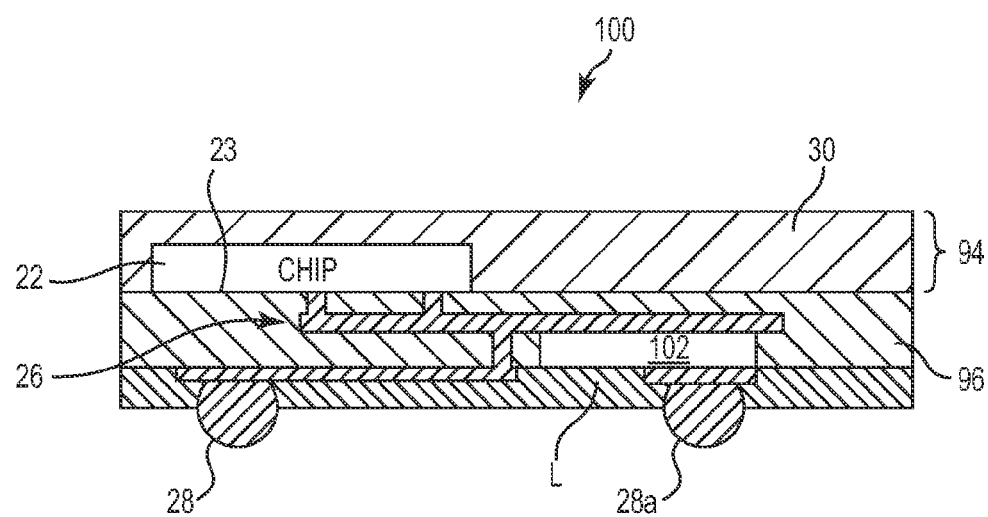
FIG. 6 is a schematic cross-sectional view of a semiconductor package including a chip and a functional element in electrical communication with an integrated circuit of the chip according to one embodiment.

FIG. 6 is a schematic cross-sectional view of a semiconductor package 100 according to one embodiment. Semiconductor package 100 includes workpiece 94 with chip 22 encapsulated in encapsulating material 30, and a functional element 102 disposed between a portion of metal trace 26 and ground ball 28a. In one embodiment, workpiece 94 is fabricated as described above and metal trace 26 or redistribution layer 26 is patterned into dielectric layer 96. Functional element 102 is subsequently attached to a portion of redistribution layer 26 prior to electrical connection with contacts 28. In this manner, the varistor 102 or diode 102 is embedded between the metal layers of trace 26 and ground ball 28a. The varistor length L meanders into the paper (e.g., the depth dimension) similar to FIG. 5F between trace 26 and ground ball 28a.

Figure 7:
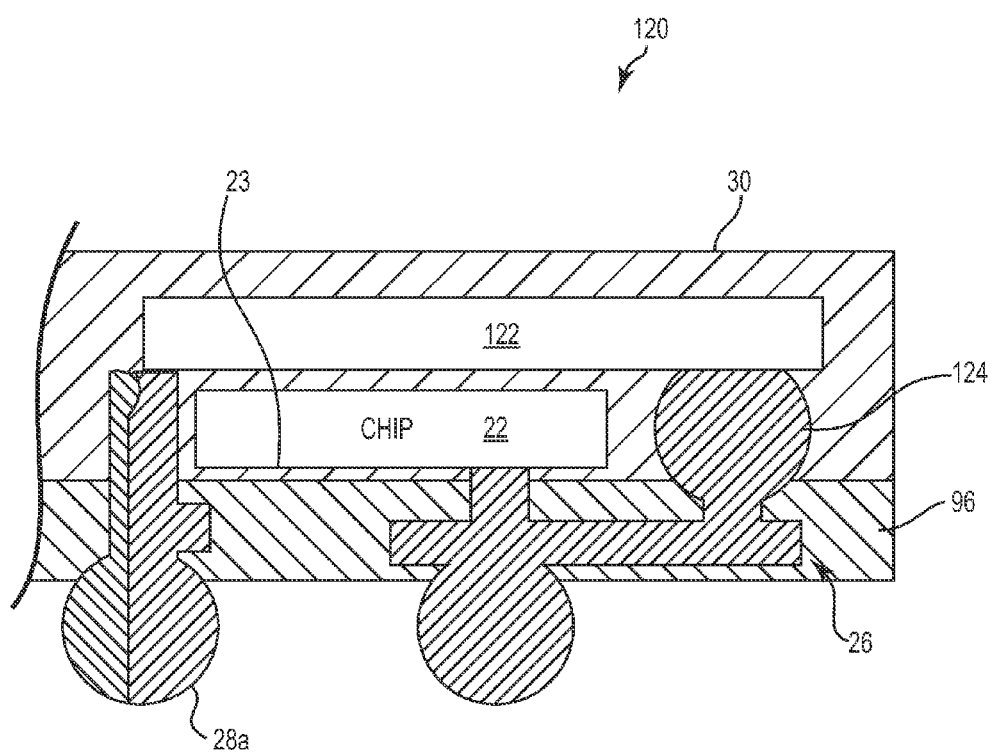
FIG. 7 is a schematic cross-sectional view of a semiconductor package including a chip and a functional element encapsulated in encapsulation material according to one embodiment.

FIG. 7 is a schematic cross-sectional view of a portion of a semiconductor package 120 according to one embodiment. Semiconductor package 120 includes chip 22 and a functional element 122 encapsulated in encapsulation material 30 where functional element 122 is disposed opposite redistribution layer 26 and electrically coupled between ground ball 28A and a separate contact 124. Functional element 122 is counter bored in encapsulation material 30.

In one embodiment, chip 22 and functional element 122 are encapsulated into a workpiece and redistribution layer 26 and contact 124 are subsequently fabricated. Functional element 122 electrically connects with integrated circuit 23 of chip 22 through contact 124 and redistribution layer 26. In one embodiment, electrical interconnection is done by a ball apply process or directly after pick-and-place of chips 22, or by laser boring of the vias after a first partial encapsulation with material 30. Thereafter, functional element 122 is attached by fluxing/placement/reflow and embedded in a second encapsulation with material 30.

Figure 8:
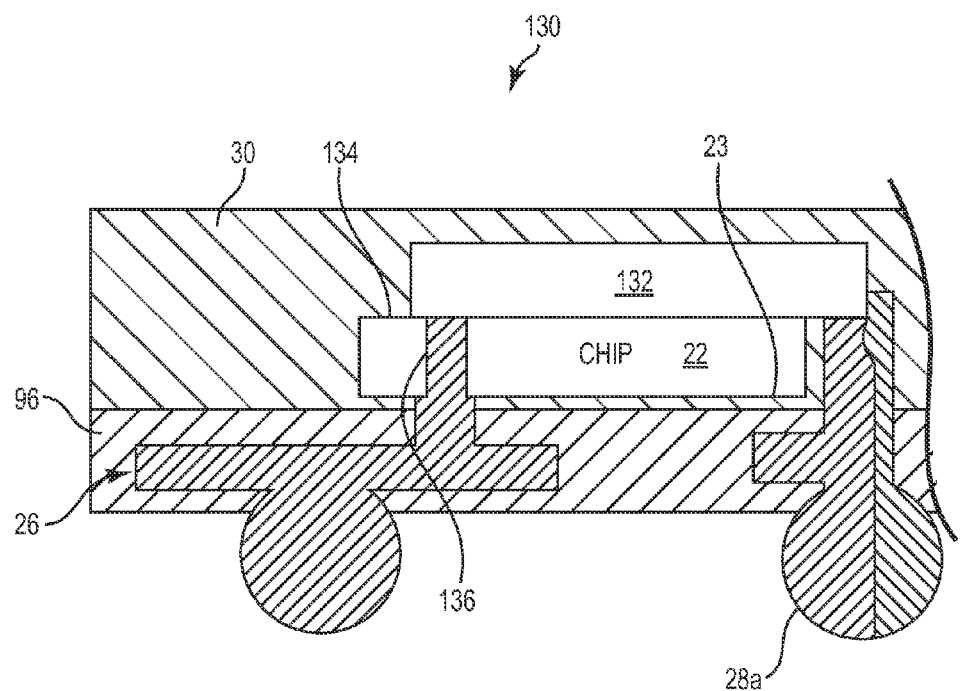
FIG. 8 is a schematic cross-sectional view of a semiconductor package including a functional element connected to a backside of a chip according to one embodiment.

FIG. 8 is a schematic cross-sectional view of a semiconductor package 130 according to another embodiment. Semiconductor package 130 includes semiconductor chip 22 and a functional element 132 encapsulated within encapsulation material 30. In one embodiment, functional element 132 is attached to a backside 134 of chip 22 and electrically connected with integrated circuit 23 through a metallized via 136 and ground ball 28a. In one embodiment, metallized via 136 is laser bore hole drilled, and the via is carbonized prior to metallization.

In one embodiment, functional element 132 is a varistor configured to shunt current from transient voltage through ground ball 28a to protect integrated circuit 23 from excessive current.

Figure 9:
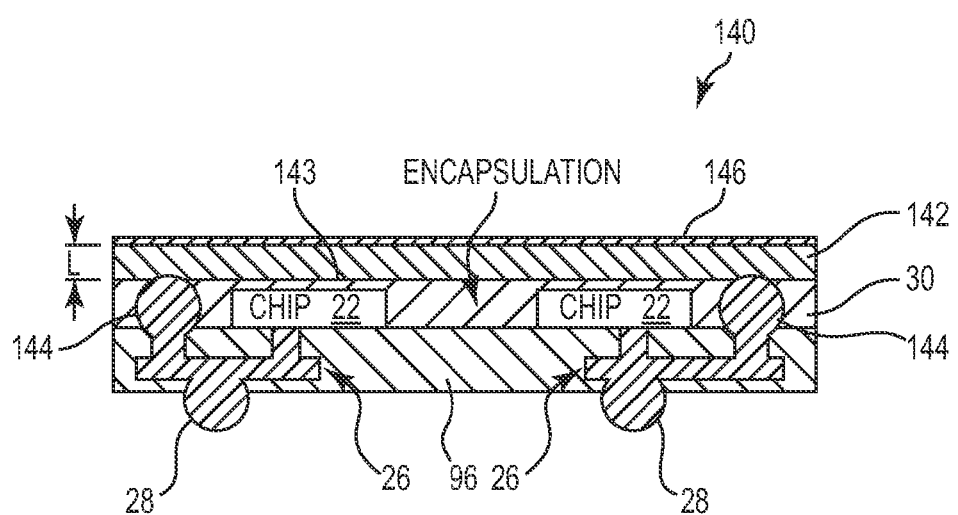
FIG. 9 is a schematic cross-sectional view of a semiconductor package including multiple chips encapsulated in encapsulation material and a functional layer connected to the encapsulation material according to one embodiment.

FIG. 9 is a schematic cross-sectional view of a semiconductor package 140 according to one embodiment. Semiconductor package 140 includes multiple semiconductor chips 22 encapsulated in encapsulation material 30 and a functional layer 142 disposed on a backside 143 of package 140. In one embodiment, functional layer 142 electrically connects with chips 22 through separate contacts 144 extending from redistribution layer 26. In one embodiment, a ground layer 146 is disposed on functional layer 142 to provide a varistor length L between contacts 144 and ground 146.

In one embodiment, functional layer 142 is provided as a varistor layer in the form of a tape or a resin fabricated from a ceramic mass of zinc-oxide grains. In one embodiment, the length L is between about 100-500 micrometers and is provided as a metal oxide varistor tape that is applied across the backside 143 of package 140. In one embodiment, the functional layer 142 provides a metal-oxide varistor layer that is configured to shunt current from transient voltage away from integrated circuits on chips 22. For example, excessive current present at ground 146 is shunted by functional layer 142 to protect the integrated circuits on chip 22.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments of semiconductor packages including a functional element, as discussed herein. Therefore, it is intended that this invention be limited only by the claims and the equivalents thereof.

What is claimed is:

1. A semiconductor package comprising:
  a semiconductor chip comprising an integrated circuit;
  a redistribution layer disposed on a first major surface proximate to the integrated circuit and including at least one contact element electrically connected to the integrated circuit and at least one ground contact element; and a functional layer disposed on the redistribution layer at least between and in contact with the at least one contact element and the at least one ground contact element, wherein the functional layer forms a functional element electrically coupled with the integrated circuit which is configured to protect the integrated circuit from transient voltage.

2. The semiconductor package of claim 1, wherein the functional comprises a variable resistance layer and the functional element is configured to shunt an excess current away from the integrated circuit.

3. The semiconductor package of claim 1, wherein the redistribution layer includes at least electrically conducting trace coupled between the semiconductor chip, the functional element, and the plurality of contact elements.

4. The semiconductor package of claim 1, wherein the functional element comprises one of a varistor and a filter configured to attenuate a portion of a frequency range in a signal.

5. The semiconductor package of claim 4, wherein the filter comprises one of a low pass filter and a high pass filter.

6. The semiconductor package of claim 1, wherein each of the plurality of contact elements and the at least one ground contact element comprise a solder ball.

7. The semiconductor package of claim 1, wherein the redistribution layer comprises a dielectric layer structured with the at least one contact element and the at least one ground contact element and include one or more metal traces electrically connecting the at least one contact element to the integrated circuit.

8. A semiconductor device comprising:
    a semiconductor chip comprising an integrated circuit proximate to a first major surface;
    encapsulation material embedding the semiconductor chip and forming a surface coplanar with the first major surface of the semiconductor chip;
    a redistribution layer disposed on the first major surface of the semiconductor chip and the surface of the encapsulation material coplanar with the first major surface of the semiconductor chip, the redistribution layer including at least one contact element electrically connected to the integrated circuit and at least one ground contact element; and
    a function layer disposed on the redistribution layer between and in contact with the at least one contact element and the at least one ground contact element, wherein the functional layer forms a shunting element configured to shunt a current away from the integrated circuit.

9. The semiconductor device of claim 8, wherein the shunting element comprises a non-ohmic variable resistor.

* * * * *